United States Patent
Hsieh et al.

(10) Patent No.: US 9,614,435 B1
(45) Date of Patent: Apr. 4, 2017

(54) POWER OPTIMIZATION DEVICE FOR ENERGY HARVESTING APPARATUS AND METHOD THEREOF

(71) Applicant: Nuvoton Technology Corporation, Hsinchu (TW)

(72) Inventors: Chung-Ming Hsieh, Hsinchu Science Park (TW); Wei-Chan Hsu, San Jose, CA (US)

(73) Assignee: NUVOTON TECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 15/190,666

(22) Filed: Jun. 23, 2016

(30) Foreign Application Priority Data

Dec. 21, 2015 (TW) .............................. 104142910 A

(51) Int. Cl.
*H02M 3/07* (2006.01)
*H03K 5/24* (2006.01)

(52) U.S. Cl.
CPC ................ *H02M 3/07* (2013.01); *H03K 5/24* (2013.01)

(58) Field of Classification Search
CPC ...................................................... H02M 3/07
See application file for complete search history.

(56) References Cited

U.S. PATENT DOCUMENTS

| | | | | |
|---|---|---|---|---|
| 6,518,830 B2 * | 2/2003 | Gariboldi | .............. | H02M 3/073 327/143 |
| 6,731,145 B1 * | 5/2004 | Humphreys | .......... | H03L 7/1075 327/147 |
| 7,795,952 B2 * | 9/2010 | Lui | ........................ | G11C 5/145 327/536 |

* cited by examiner

*Primary Examiner* — Hai L Nguyen
(74) *Attorney, Agent, or Firm* — Muncy, Geissler, Olds & Lowe, P.C.

(57) ABSTRACT

A power optimization device and method thereof for energy harvesting apparatus are disclosed. The power optimization device includes a charge pump, a voltage comparator, an output switch, a counter and a frequency control module. By detecting the voltage outputted from the power optimization device under various operating frequencies to obtain a calculation result and increase or decrease an operating frequency of the charge pump according to the calculation result, so as to dynamically adjust the operating frequency to optimize the power outputted from the power optimization device according to the voltage outputted from the energy harvesting apparatus to an electricity storage unit and energy loss caused by the change of the operating frequency.

10 Claims, 17 Drawing Sheets

POWER OPTIMIZATION DEVICE FOR ENERGY HARVESTING APPARATUS AND METHOD THEREOF

CROSS-REFERENCE TO RELATED APPLICATION

This application claims the benefit of Taiwan Patent Application No. 104142910, filed on Dec. 21, 2015, the disclosure of which is incorporated herein in its entirety by reference, in the Taiwan Intellectual Property Office.

BACKGROUND OF THE INVENTION

1. Field of the Invention

The present disclosure relates to a power optimization device and method for energy harvesting apparatus, more particularly to a power optimization device capable of adjusting operating frequency of a charge pump circuit to track a maximum power point for optimizing the power outputted from the energy harvesting apparatus.

2. Description of the Related Art

Energy harvesting technology, which is used to harvest energy from the nature (such as light, heat, electromagnetic energy or vibration), has been applied in many fields for a long time. The way of harvesting such energy is similar to that of green power, but the difference between them is that the energy harvesting technology is used to harvest energy from a very weak energy source.

With progress of the integrated circuit and network technologies, many companies pay more attention in applications of wearable devices and internet of thing (IoT), and the energy harvesting technology is closely related to these two applications. For example, in the field of IoT, many wireless sensor networks (WSN) are required to detect and transmit data, but it also takes a lot of time and labor costs to connect a large number of WSNs with wired electric power grids or replace their batteries. The energy harvesting technology can enable the WSNs to obtain energy from surroundings, so as to reduce dependence on wired electric power grid or the battery. In addition, subject to a relatively small volume, the wearable product is usually provided with a small-size battery and has a limited operating time due to the limited power supplied by the small-size battery. If the energy harvesting technology can be applied in the wearable product, the wearable product can obtain energy from surroundings rather than from the battery, so it is beneficial to save battery life and reduce times of replacing or charging of the battery of the wearable product.

In order to obtain the energy from surroundings, a transducer is required to convert the energy from the surroundings (such as light energy or heat) into voltage or current which is acceptable for IC. A solar cell converting light energy into electrical energy is taken as an example for illustration below. Please refer to FIG. 1 which shows output current versus output voltage curves and output power versus output voltage curves of the solar cell. As shown in FIG. 1, a conversion curve of the solar cell is nonlinear and different from an ideal voltage or current source, and has a maximum value called as a maximum power point (MPP). In order to obtain the maximum power, the power converter connected to the output of the solar cell preferably keeps the working point in the maximum power point. Please refer to FIG. 1B which shows output current versus output voltage curves and output power versus output voltage curves of a common piezoelectric converter. The piezoelectric converter has I-V characteristic different from the solar cell, but also has a maximum power point.

After the transducer converts the energy from the nature into the electrical energy, the power converter converts the output of the transducer into the voltage and current which is acceptable for a post-stage system. Generally speaking, the power outputted from the transducer is very weak, so the power converter is required to have very high power conversion efficiency. A DC/DC switching converter, which has very high conversion efficiency, is widely applied in various applications. For example, a buck converter can be applied in fields of the solar cell and vibration energy harvesting, and a boost converter can be applied in fields of the solar cell and heat harvesting. Although having high conversion efficiency, the conventional DC/DC switching converter needs an inductor as an energy storage element. However, the inductor usually has a large volume and is disadvantageous to the wearable product.

SUMMARY OF THE INVENTION

An objective of the present disclosure is to provide a power optimization device for energy harvesting apparatus, to solve above-described problems. The power optimization device includes a charge pump, a voltage comparator, an output switch, a counter and a frequency control module. The charge pump has an input terminal, an output terminal, and a control terminal, and configured to receive an input voltage of the energy harvesting apparatus by the input terminal, and output an output voltage according to an operating frequency by the output terminal. The voltage comparator is electrically connected to the output terminal of the charge pump and configured to compare a voltage of the output terminal of the charge pump with a reference voltage, and output a first comparison signal when the voltage is equal to or higher than the reference voltage. The output switch is electrically connected between the output terminal of the charge pump and an electricity storage unit, and switched between a turn-on status and a turn-off status according to the first comparison signal. The counter is electrically connected to an output terminal of the voltage comparator, and configured to receive the first comparison signal and respectively record the times of the voltages of the output terminal of the charge pump equal to or higher than the reference voltage in voltage accumulation durations under different operating frequencies, so as to generate a plurality of counting results. The frequency control module is electrically connected between the counter and the control terminal of the charge pump, and configured to compare the counting results generated in the two adjacent voltage accumulation durations to generate a second comparison result, and adjust the operating frequency of the charge pump according to the second comparison result.

Preferably, the frequency control module further includes a counting register, a comparator and a frequency control unit. The counting register is configured to store the two counting results respectively generated in the two adjacent voltage accumulation durations, and one of the two counting results is generated later than the other. The comparator is configured to compare the two counting results and output the second comparison signal. The frequency control unit is electrically connected between the comparator and the control terminal of the charge pump. When the second comparison signal indicates that the counting result generated later is higher than the other, the frequency control unit is configured to increase the operating frequency according to the second comparison signal, and when the second comparison signal indicates that the counting result generated latter is lower than the other, the frequency control unit is configured to decrease the operating frequency according to the second comparison signal.

Preferably, the frequency control unit includes a digital comparator and a numerically controlled oscillator. The numerically controlled oscillator is configured to output a clock signal to the control terminal of the charge pump. The digital comparator is configured to compare the values stored in the counting register, and the numerically controlled oscillator increases or decreases frequency of the clock signal thereof according to a comparison result of the digital comparator, so as to adjust the operating frequency of the charge pump.

Preferably, the reference voltage is defined by the voltage of the output terminal plus a preset voltage.

Preferably, the power optimization device further includes a low frequency oscillator electrically connected to the counter. The low frequency oscillator is configured to generate the voltage accumulation duration, and a waiting duration between the two adjacent voltage accumulation durations.

Other objective of the present disclosure is to provide a power optimization method for energy harvesting apparatus. The method is applied to operate the above-mentioned power optimization device, and includes following steps: at an input terminal of a charge pump of the power optimization device, receiving an input voltage from the energy harvesting apparatus, and at an output terminal of the power optimization device, outputting an output voltage according to an operating frequency; comparing, by a voltage comparator of the power optimization device, the voltage of the output terminal of the charge pump with a reference voltage, and outputting a first comparison signal when the voltage of the output terminal of the charge pump is equal to or higher than the reference voltage; controlling an output switch which is electrically connected between the output terminal of the charge pump and an electricity storage unit, to switch between a turn on status and a tumrn-off status according to the first comparison signal; receiving the comparison signal, by a counter of the power optimization device, and respectively recording times of the voltages of the output terminal of the charge pump equal to or higher than the reference voltage under different operating frequencies, so as to generate a plurality of counting results; comparing the two counting results generated in the two adjacent voltage accumulation durations, by a frequency control module of the power optimization device, to generate a second comparison result, and then adjusting the operating frequency of the charge pump according to the second comparison result.

Preferably, the step of adjusting the operating frequency of the charge pump according to the second comparison result further includes steps of: storing, by two counting registers, two counting results respectively generated by the counter in the two adjacent voltage accumulation durations, wherein one of the two counting results is generated later than the other; comparing, by a comparator of the power optimization device, the two counting results to output the second comparison signal; and increasing, by a frequency control unit of the power optimization device, the operating frequency when the counting result generated later is higher than the other; decreasing the operating frequency when the counting result generated later is lower than the other.

Preferably, the step of adjusting the operating frequency according to the second comparison signal, further includes steps of: comparing, by a digital comparator, the values stored in the counting registers; providing a numerically controlled oscillator to output a clock signal to the control terminal of the charge pump; increasing or decreasing a frequency of the clock signal of the numerically controlled oscillator according to a comparison result of the digital comparator, so as to adjust the operating frequency of the charge pump.

Preferably, the reference voltage is defined by the voltage of the output terminal plus a preset voltage.

Preferably, the method further includes a step of providing a low frequency oscillator to generate the voltage accumulation duration and a waiting duration between the two adjacent voltage accumulation durations.

BRIEF DESCRIPTION OF THE DRAWINGS

The detailed structure, operating principle and effects of the present disclosure will now be described in more details hereinafter with reference to the accompanying drawings that show various embodiments of the present disclosure as follows.

DETAILED DESCRIPTION OF THE PREFERRED EMBODIMENTS

Figure 1A:
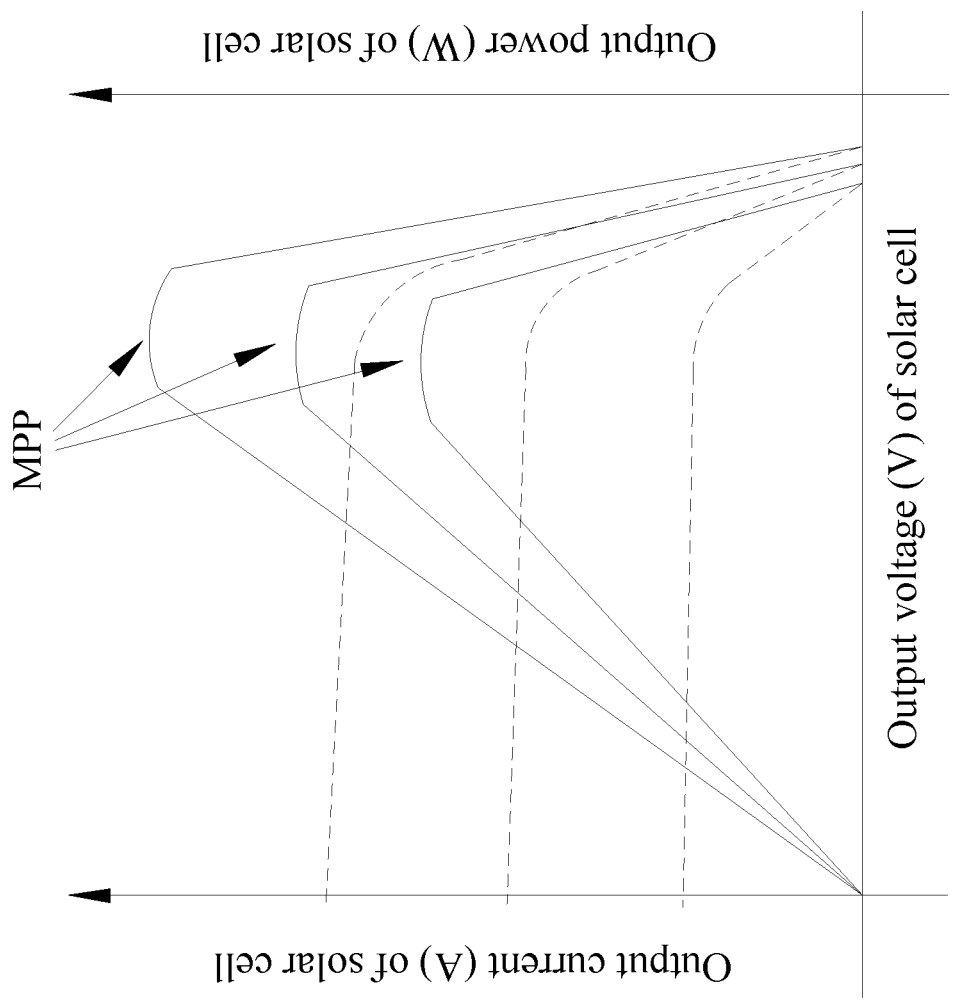
FIG. 1A shows current versus voltage curves and power versus voltage curves of output of a conventional solar cell.
Figure 1B:
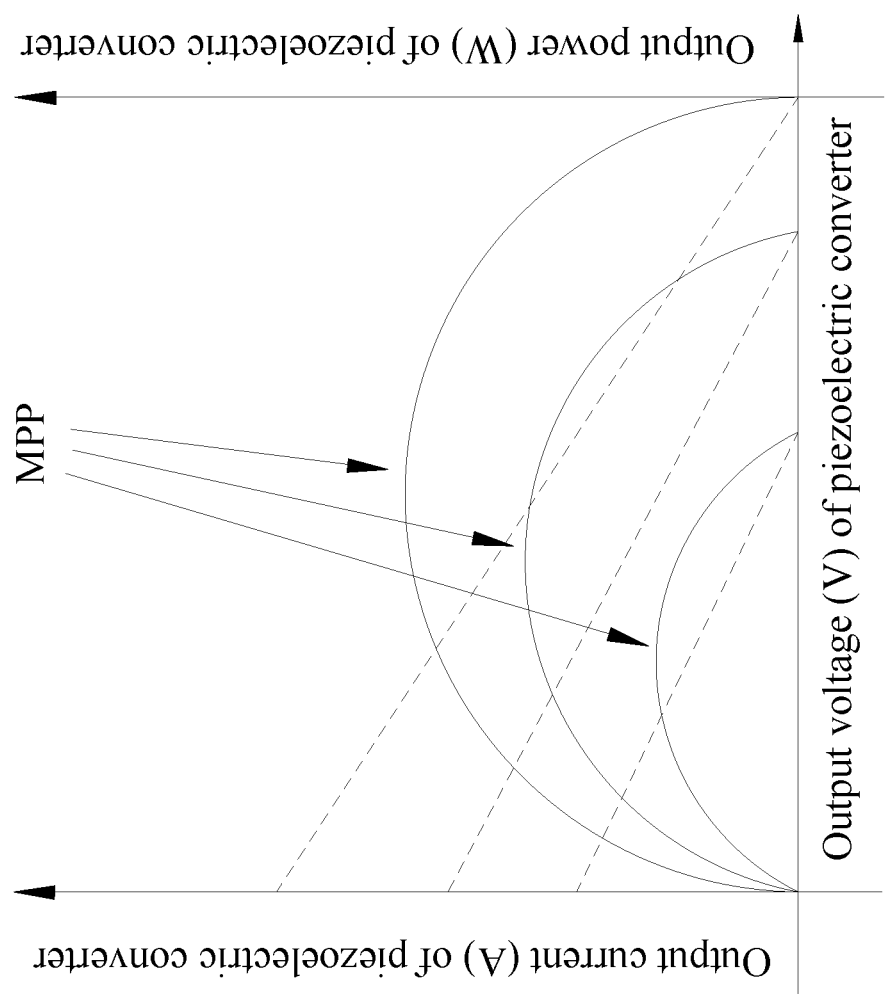
FIG. 1B shows current versus voltage curves and power versus voltage curves of output of a conventional piezoelectric transducer.

Reference will now be made in detail to the exemplary embodiments of the present disclosure, examples of which are illustrated in the accompanying drawings. Therefore, it is to be understood that the foregoing is illustrative of exemplary embodiments and is not to be construed as limited to the specific embodiments disclosed, and that modifications to the disclosed exemplary embodiments, as well as other exemplary embodiments, are intended to be included within the scope of the appended claims. These embodiments are provided so that this disclosure will be thorough and complete, and will fully convey the inventive concept to those skilled in the art. The relative proportions and ratios of elements in the drawings may be exaggerated or diminished in size for the sake of clarity and convenience in the drawings, and such arbitrary proportions are only illustrative and not limiting in any way. The same reference numbers are used in the drawings and the description to refer to the same or like parts.

It will be understood that, although the terms 'first', 'second', 'third', etc., may be used herein to describe various elements, these elements should not be limited by these terms. The terms are used only for the purpose of distinguishing one component from another component. Thus, a first element discussed below could be termed a second element without departing from the teachings of embodiments. As used herein, the term "or" includes any and all combinations of one or more of the associated listed items.

Figure 2A:
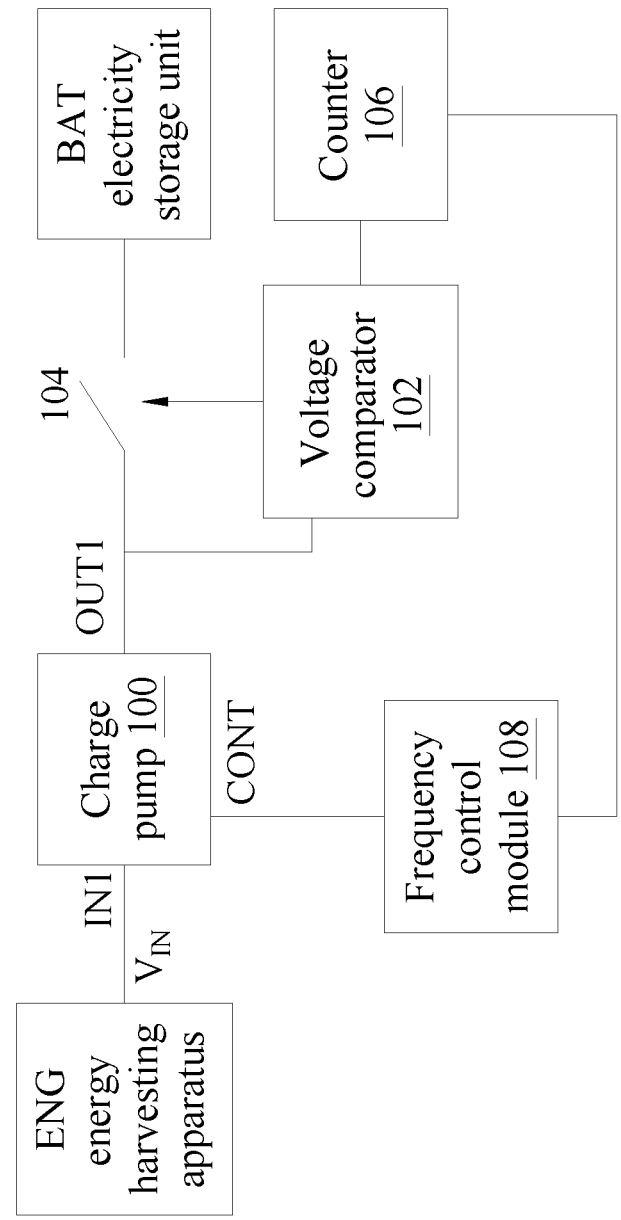
FIG. 2A is a block diagram of a power optimization device for energy harvesting apparatus, in accordance with the present disclosure.

Please refer to FIG. 2A which is a block diagram of an embodiment of a power optimization device for an energy harvesting apparatus, in accordance with the present disclosure. A power optimization device 1 includes a charge pump 100, a voltage comparator 102, an output switch 104, a counter 106 and a frequency control module 108. The charge pump 100 has an input terminal IN1, an output terminal OUT1 and a control terminal CONT1. The charge pump 100 is configured to receive an input voltage VIN from an energy harvesting apparatus ENG through the input terminal IN1, and according to an operating frequency f output an output voltage $V_{OUT}$ through the output terminal OUT1. The energy harvesting apparatus ENG can be a transducer having a function of converting light energy or thermal energy into electric energy acceptable for an integrated circuit. For example, the energy harvesting apparatus ENG can be a solar cell capable of converting light energy into electric energy; or, a piezoelectric transducer capable of converting vibration energy into electric energy.

As shown in FIG. 1A, maximum power points of the solar cell under various strength of light are about between seventy percent to eighty percent of an open-circuit voltage Voc, so the output voltage of the solar cell is usually designed to be fixed in a range from seventy percent to eighty percent of the open-circuit voltage Voc, so as to enable the solar cell to output the maximum power in most cases. The above-mentioned manner is easy to design the circuit of the solar cell, but hardly to compensate a variation of the Voc attributable to a change of temperature. Particularly, the change of the temperature affects the Voc and the maximum power point significantly, so the way of using the constant voltage is hardly to obtain the maximum power under different temperatures. In addition, if the solar is required to adjust correspondingly to the open-circuit voltage, the solar must be stopped to detect the open-circuit voltage, which results in unnecessary energy loss.

Therefore, a power converter based on the charge pump is applied in the present disclosure to solve the above-mentioned problems. For example, a boost charge pump, which is without an inductor and not affected easily by the ambient temperature, is suitable as the power converter for the solar cell and the thermal tag. It should be noted that when the power converter based on the charge pump is applied to the energy harvesting apparatus ENG having a relative large internal resistance and a maximum power point, an output maximum power point of the power converter is not the same as an input maximum power point thereof. A way of tracking the output maximum power point of the power converter will be described in detail.

Figure 2B:
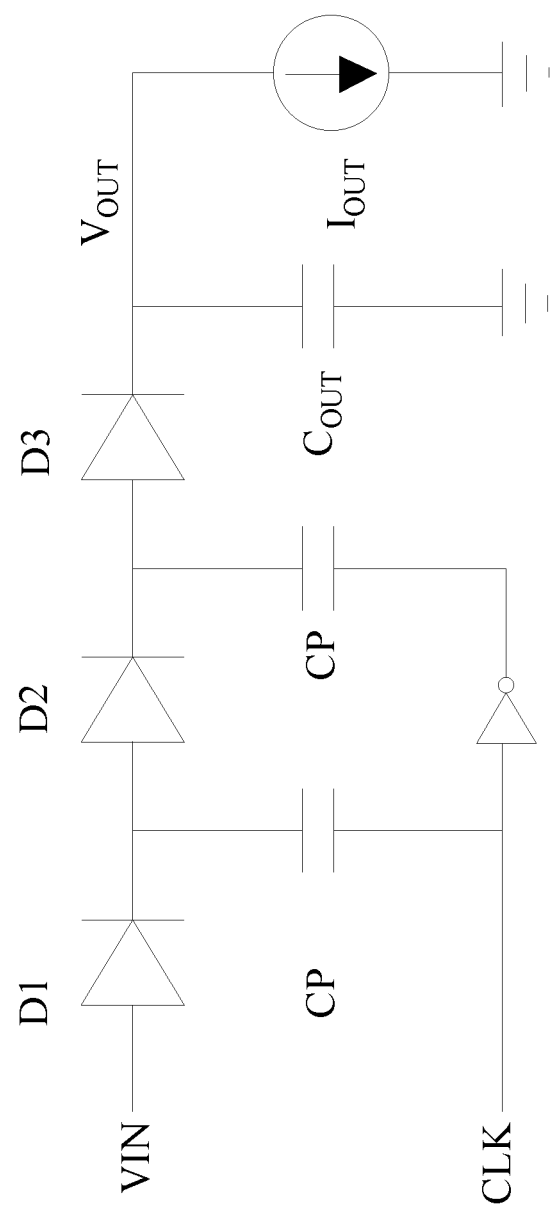
FIG. 2B shows an example of a charge pump circuit of the power optimization device of the present disclosure.
Figure 2C:
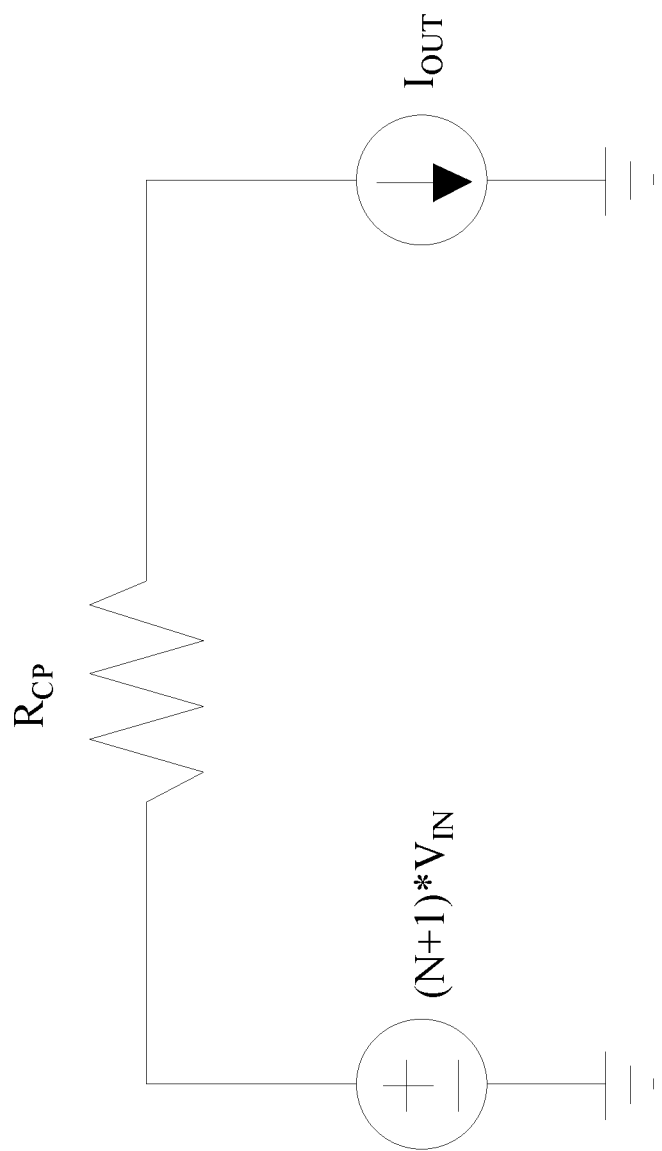
FIG. 2C shows an equivalent circuit for the charge pump circuit of the power optimization device of the present disclosure.

Please refer to FIGS. 2B and 2C which respectively show a circuit layout and an equivalent circuit of the charge pump 100. The charge pump 100 is a common charge pump and includes a plurality of diodes D1, D2 and D3, and a plurality of capacitors CP. A clock signal CLK is applied to turn on/off the plurality of diodes D1, D2 and D3, so as to control an operating frequency f of the charge pump 100. The charge pump 100 is operative to output an output voltage $V_{OUT}$ and an output current $I_{OUT}$. The output voltage $V_{OUT}$ can be obtain by calculation according to an input voltage $V_{IN}$ of the energy harvesting apparatus ENG and an equation (1) below:

$$V_{OUT}=(N+1)*V_{IN}-[N/(f*CP)]*I_{OUT} \qquad (1)$$

where N is number of stages of the charge pump. The equivalent circuit of the charge pump 100 is shown in FIG. 2C, and an equivalent resistance $R_{CP}$ of the charge pump 100 can be obtained by calculation according to an equation (2) below:

$$R_{CP}=N/(f*CP) \qquad (2)$$

Figure 2D:
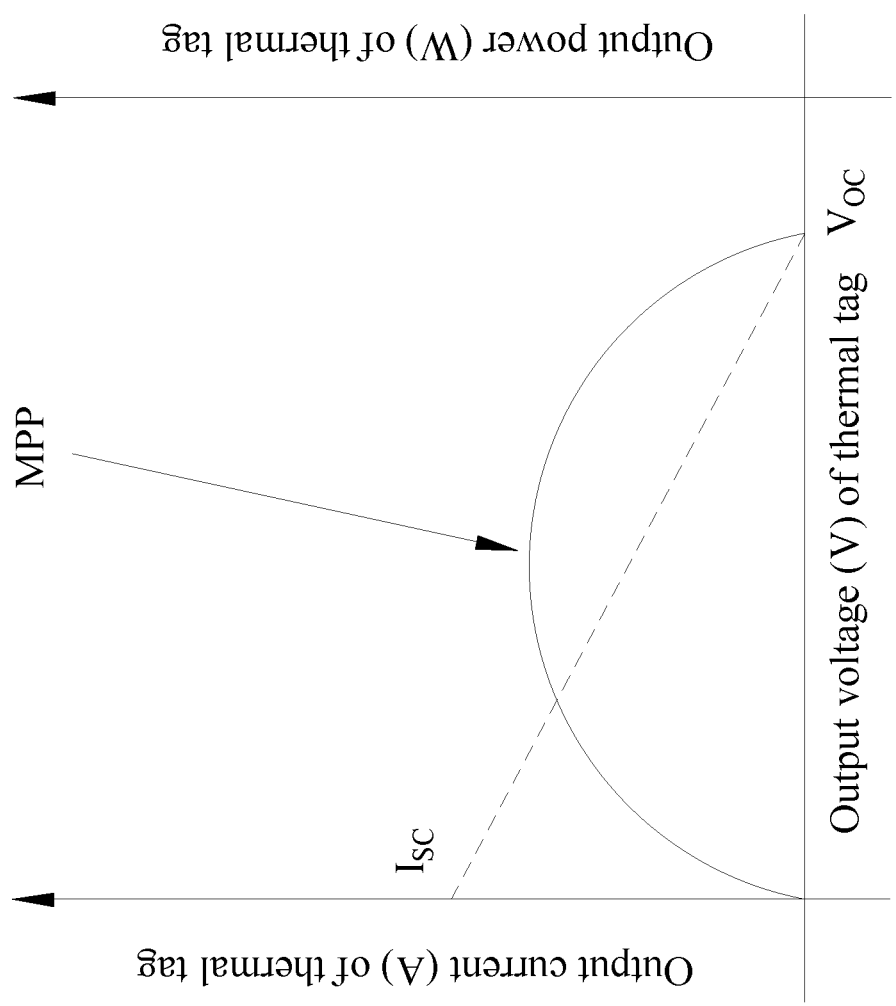
FIG. 2D shows a current versus voltage curve and a power versus voltage curve of the energy harvesting apparatus.
Figure 2E:
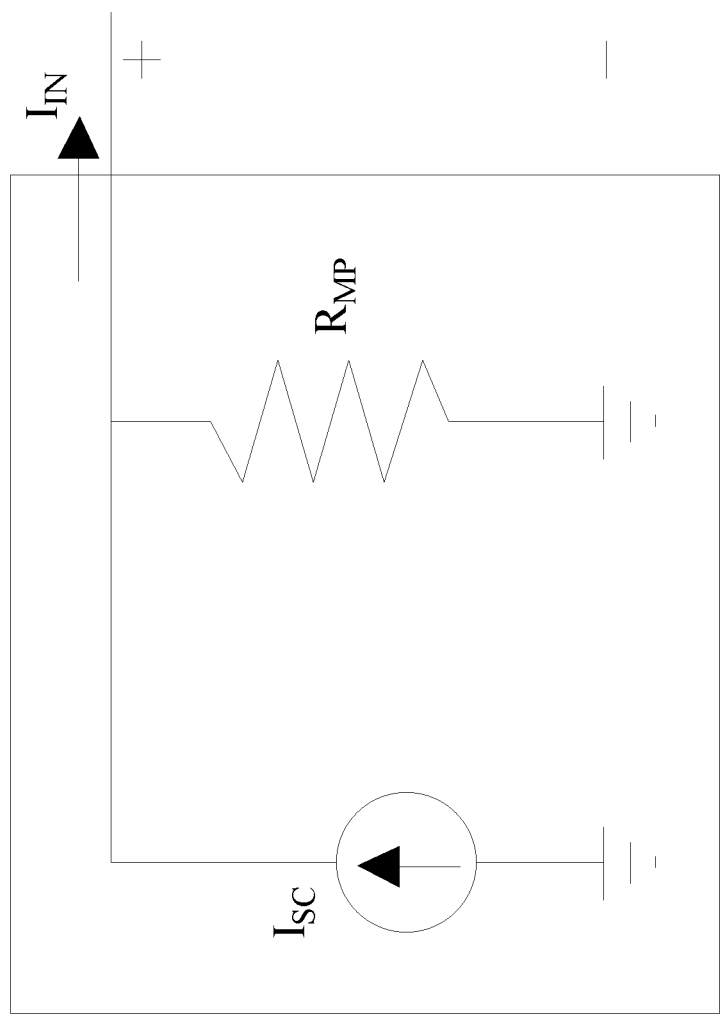
FIG. 2E shows an equivalent circuit of the energy harvesting apparatus.

For convenience in exemplary explanation, the thermal tag having characteristics similar to the solar cell and V-I relationship advantageous to convenient calculation, is taken as an example of the energy harvesting apparatus ENG. Please refer to FIGS. 2D and 2E which respectively show a current versus voltage curve and a power versus voltage curve of an equivalent circuit of the thermal tag. The equivalent circuit includes a short-circuit current source $I_{sc}$ and an internal resistance $R_{MP}$, and an input voltage $V_{IN}$ and an input current $I_{IN}$ inputted into the charge pump 100. The input voltage $V_{IN}$ and the input current $I_{IN}$ satisfy an equation (3) below:

$$I_{IN}=I_{SC}-(I_{SC}/V_{OC})*V_{IN} \qquad (3)$$

According to the equations (1) to (3), the input power $P_{IN}$ and the output power Poor satisfy an equation (4) below:

$$P_{IN}=I_{IN}*V_{IN}=[I_{SC}-(1/R_{MP})*V_{IN}]V_{IN} \qquad (4)$$

When the power loss $P_{LOSS}$ directly dissipated in the $R_{CP}$ is considered, the output power can be calculated according to an equation (5) below:

$$P_{OUT}=P_{IN}-P_{LOSS}=P_{IN}-R_{CP}*[I_{SC}-V_{IN}/R_{MP}]^2/(N+1)^2 \qquad (5)$$

Figure 2F:
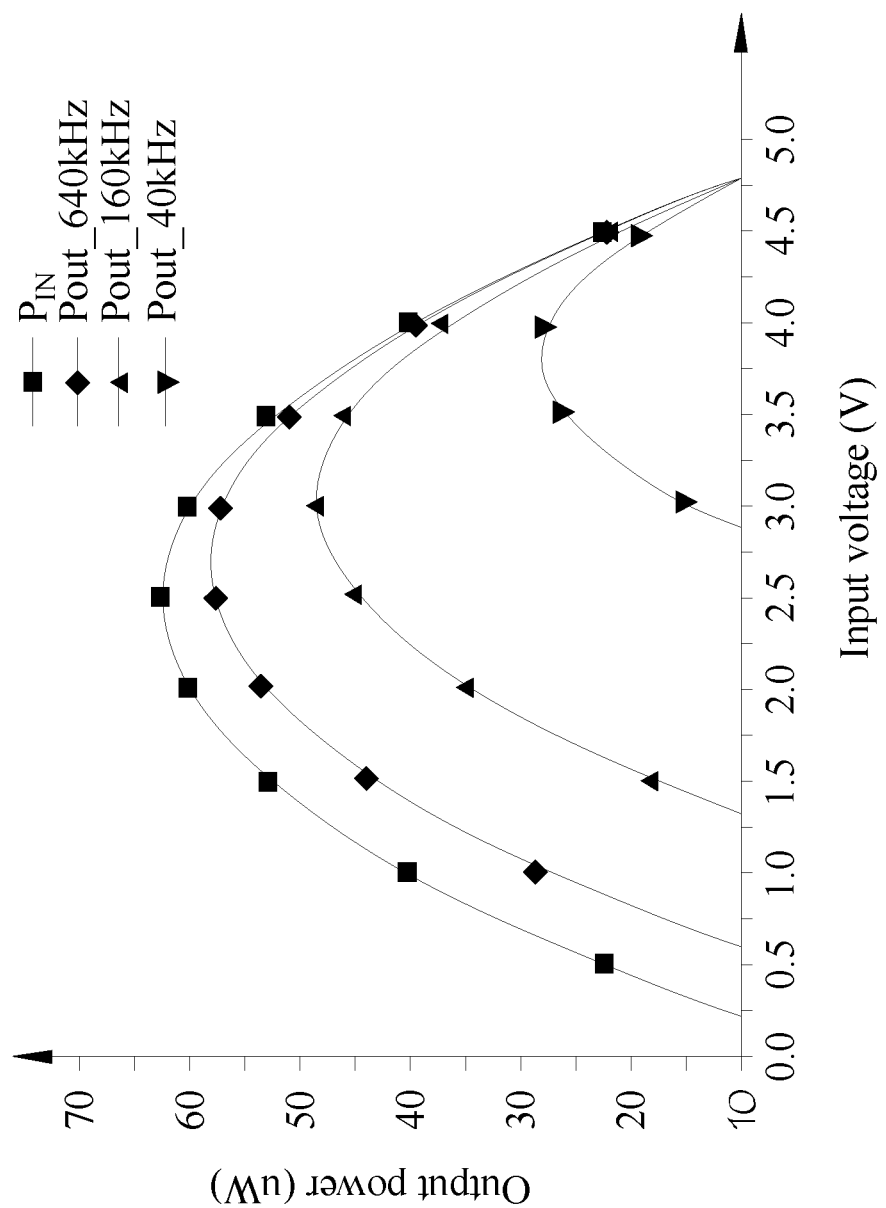
FIG. 2F shows output power versus input voltage curves of the charge pump under different operating frequencies.

The equivalent resistance $R_{CP}$ is varied under different frequency and dissipates a part of the input power, it is the reason why the output power may not be the maximum value even if the input voltage is located at the maximum input power point. Please refer to FIG. 2F which shows output power versus input voltage curves under different frequencies. For example, the output power under conditions of 2.5V of $V_{IN}$ and 160 KHz of frequency is lower than the output power under condition of 2V of $V_{IN}$ and 640 KHz of frequency, and is almost the same as the output power under a condition that the VIN is down to 1.5V and the frequency is 160 KHz. As a result, it is obvious that the output power curve under a higher frequency is more approaching to the input power curve. Theoretically, when the frequency is nearly infinitive, the output power curve is equal to the input power curve and the conversion efficiency is 100%.

Please refer to FIG. 2A. The charge pump 100 is electrically connected between an electricity storage unit BAT and the energy harvesting apparatus ENG. The deduction of the maximum output power with the consideration of actual situation is described below. It is assumed that the charge pump 100 is configured to charge the electricity storage unit BAT (such as a battery or a capacitor). During the charging process, the output power of the charge pump 100 is low but the capacitance of the electricity storage unit BAT is very large, so during the deduction the output voltage of the charge pump 100 can be viewed as an ideal voltage source to obtain the relationship between the input voltage and the frequency. The voltage $V_{BAT}$ of the electricity storage unit BAT and the input voltage $V_{IN}$ can be obtained according to equations (6) and (7) below:

$$V_{BAT}=(N+1)*V_{IN}-R_{CP}*I_{OUT}$$

$$=V_{IN}*[N+1+(R_{CP}/R_{MP})/(N+1)]-R_{CP}*I_{SC}/(N+1) \quad (6)$$

$$V_{IN}=[V_{BAT}+R_{CP}*I_{SC}/(N+1)]/[N+1+(R_{CP}/R_{MP})/(N+1)] \quad (7)$$

Under a condition the $V_{BAT}$ is nearly a constant voltage, the VIN is a function of $V_{BAT}$ and $R_{CP}$ (that is, frequency), and approaching to $V_{OUT}/(N+1)$ when the frequency is higher. Higher the frequency is, lower the $R_{CP}$ and the $P_{LOSS}$ are.

A magnitude of the output power $P_{OUT}$ can be calculated according to an equation (8) below:

$$P_{OUT}=V_{BAT}*I_{OUT}$$

$$=V_{BAT}*I_{IN}/(N+1)$$

$$=V_{BAT}*(I_{SC}-V_{IN}/R_{MP})/(N+1) \quad (8)$$

According to the equation (8), the $P_{OUT}$ is a function of $V_{IN}$, and the $V_{IN}$ is the function of $V_{BAT}$ and $R_{CP}$ (that is, frequency), so as to obtain the relationship between the $V_{IN}$ and $V_{OUT}$. According to the above description, among from the number N of the stage of the charge pump and the capacitance value of the capacitor CP, the charge-pump-based energy transducer can just adjust the operating frequency f of the charge pump 100 to control the relation between the $V_{IN}$ and $V_{OUT}$. However, for a charge-pump-based energy transducer, the number of stage N of the charge pump and the capacitor CP are hardly to adjust flexibly, so the adjustment of the whole output power is mainly dependent on the operating frequency f.

Figure 2G:
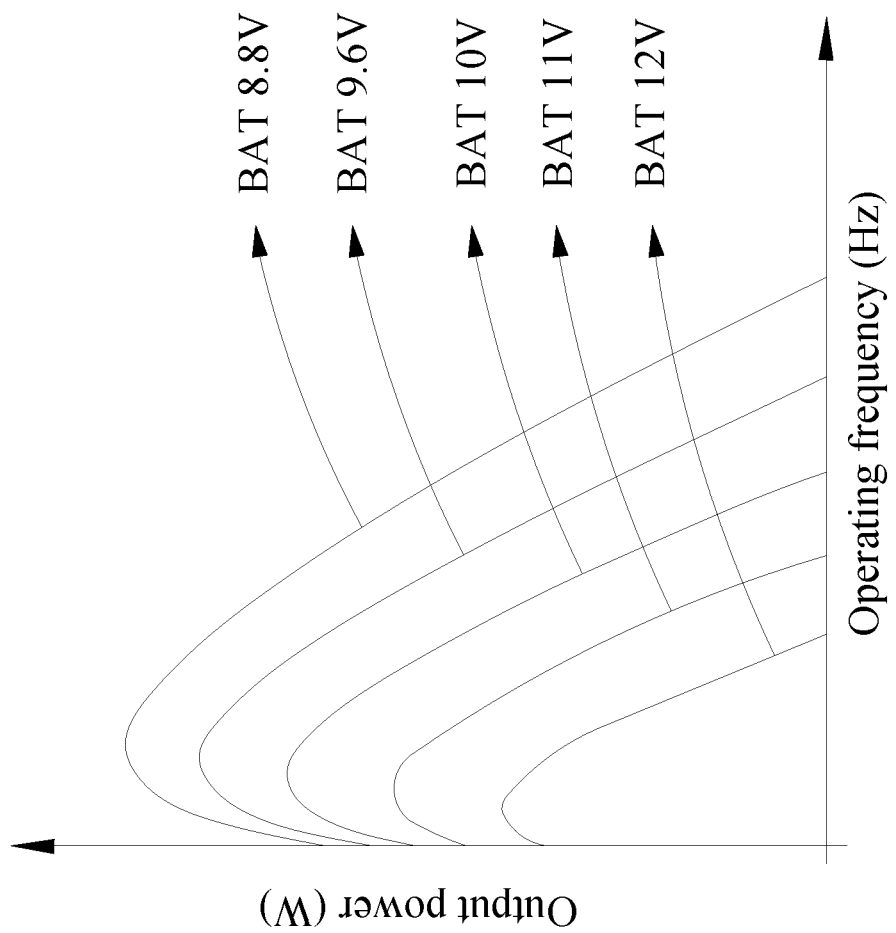
FIG. 2G is power versus operating frequency curves of the charge pump under considerations of conduction loss and dynamic switching loss.

According to the equations above, a location of the output maximum power point is almost irrelevant to the location of the input maximum power point, and only the operating frequency f is positively relevant to the output maximum power point. Higher the operating frequency f is, the power loss $P_{LOSS}$ caused by the equivalent resistance $R_{CP}$ is lower, and higher the output power $P_{OUT}$ is. Among from the power loss $P_{LOSS}$, total conduction loss and switching loss of the circuit can further be considered for tracking the maximum output power. Please refer to FIG. 2G which shows a power versus frequency curve under the consideration of the conduction loss and the switching loss. It is obvious that the power versus voltage curve is a para-curve under the consideration of the above-mentioned losses and the maximum power corresponds to a specific operating frequency. Therefore, an objective of the power optimization device of the present disclosure is to keep the operating frequency f at the specific frequency, and automatically adjust the operating frequency to obtain the maximum output power for various output voltage.

Please refer back to FIG. 2A. In order to achieve the purpose of tracking the maximum output power, a voltage comparator 102 is connected to the output terminal OUT1 of the charge pump 100 and configured to compare the voltage VOUT of the output terminal OUT1 with a reference voltage VREF. The reference voltage VREF can be provided by an external device or built in the voltage comparator 102. When the voltage VOUT of the output terminal OUT1 of the charge pump 100 exceeds the reference voltage, the voltage comparator 102 outputs a first comparison signal.

An output switch 104 is connected between the output terminal OUT1 of the charge pump 100 and the electricity storage unit BAT, and controlled to switch between turn-on and turn-off statuses according to the first comparison signal. The counter 106 is connected to the output terminal of the voltage comparator 102 and configured to receive the comparison signal and count the times of the voltage $V_{OUT}$ of the output terminal OUT1 of the charge pump 100 exceeding the reference voltage $V_{REF}$ in voltage accumulation duration Tacc, to generate a plurality of counting results.

The frequency control module 108 is connected between the counter 106 and the control terminal CONT and configured to compare the counting results respectively generated in two adjacent voltage accumulation durations Tacc, to generate a second comparison result and then control the operating frequency f of the charge pump according to the second comparison result.

Ideally, the charge pump 100 operating in a higher operating frequency f can output a higher power; however, in the actual situation, the charge pump 100 operating in the higher operating frequency f also has more power consumption which is positively correlate with the operating frequency f. Therefore, the output power $P_{OUT}$ can be the input power $P_{IN}$ subtracted by the power loss $P_{LOSS}$. Every time the operating frequency f is increased, the new output power $P_{OUT}$ can be compared with the previous output power $P_{OUT}$, and if the new output power $P_{OUT}$ larger than the previous output power $P_{OUT}$, it indicates that the addition of the output power $P_{OUT}$ is larger than that of the power loss $P_{LOSS}$ after the operating frequency f is added, so the operating frequency f can be continuously added for higher output power $P_{OUT}$. The addition of the operating frequency f and comparison of the current and previous output powers $P_{OUT}$ are repeated until the current output powers $P_{OUT}$ is lower than the previous output power $P_{OUT}$, it indicates that the previous output powers $P_{OUT}$ is the maximum output power $P_{OUT}$. Next, the frequency control module 108 stops increasing the operating frequency f, but start to decrease the operating frequency f, and the current and previous output powers $P_{OUT}$ are compared again. As a result, the operating frequency f and the output power $P_{OUT}$ can be maintained as optimization values.

Figure 3:
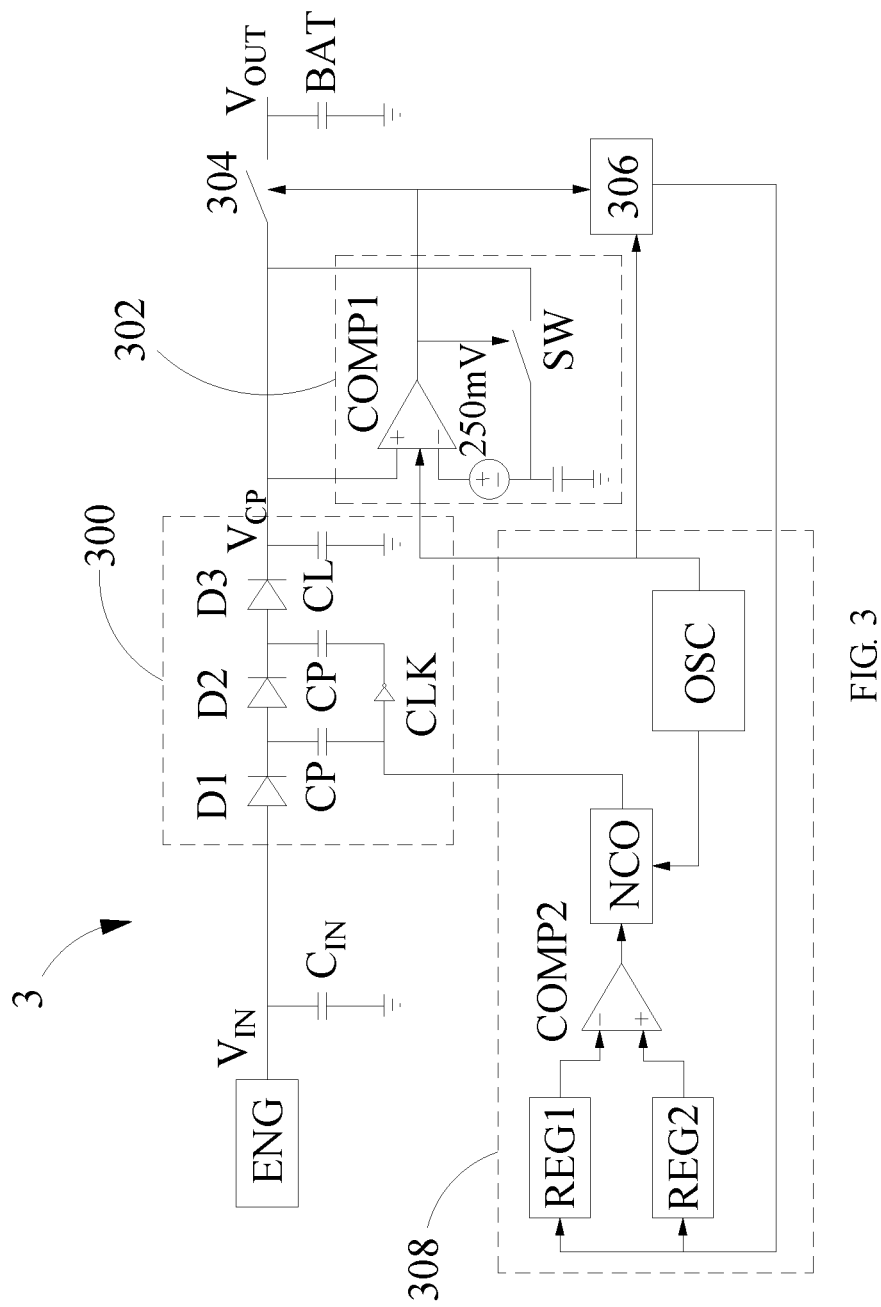
FIG. 3 is schematic circuit diagram of other embodiment of the power optimization device of the present disclosure.

Please refer to FIG. 3 which shows a circuit diagram of other embodiment of the power optimization device for energy harvesting apparatus, in accordance with the present disclosure. As shown in FIG. 3, the power optimization device 3 includes a charge pump 300, a voltage comparator 302, an output switch 304, a counter 306 and a frequency control module 308. The charge pump 300 includes a plurality of diodes D1, D2 and D3, and capacitors CP and CL, and is configured to receive a clock signal CLK. The charge pump 300 has an input terminal configured to receive an input voltage $V_{IN}$ of the energy harvesting apparatus ENG, and an output terminal configured to output a charge pump output voltage VCP which corresponds to an operating frequency f.

Particularly, the voltage comparator 302 includes a comparator COMP and a switch SW, and the reference voltage can be 250 mV. When the comparator COMP1 generates an output signal indicative of the output voltage $V_{OUT}$ exceeding 250 mV, the counter 306 receives the output signal and up counts by one. The operations of comparison and counting are repeated in the voltage accumulation duration Tacc, so that the times of the voltage of the output terminal of the charge pump 300 exceeding the reference voltage can be recorded after the operating frequency f is changed.

Moreover, it is to be noted that the frequency control module 308 can include counting registers REG1 and REG2, a comparator COMP2, a numerically controlled oscillator (NCO) and a low-frequency oscillator OSC. The counting registers REG1 and REG2 are configured to store the counting results respectively generated by the counter 306 in two adjacent accumulation durations Tacc. For example, the counting results for the Nth and the (N+1)th voltage accumulation durations can be respectively stored in the registers REG1 and REG2 and then compared with each other, so that the power optimization device 3 of the present disclosure can be implemented without an analog comparator with higher power consumption. Every time the accumulated charge pump output voltage VCP exceeds the 250 mV, the comparator COMP1 outputs a signal with high level to turn on the switch 304, so that the energy stored in the capacitor CL can be delivered to the electricity storage unit BAT. The duration for accumulating the charge pump output voltage VCP is referred as the accumulation duration.

The operation of the power optimization device 3 in the two durations will be described in reference with the drawings. During the operation, the output current of the power optimization device 3 is usually very weak (such as, in microampere level), it is not easy to compare the output current and the variation of the input voltage or the output voltage is very slow, so the measurement of the output power $P_{OUT}$ is preferably performed after the frequency is changed and held for a waiting duration Twait to make the input voltage $V_{IN}$ stable; however, the present disclosure is not limited thereto. The waiting duration Twait and the accumulation duration Tacc is set to solve the problem of slow response speed of the energy harvesting apparatus ENG. If the energy harvesting apparatus ENG can quickly respond to change of the operating frequency, the waiting duration Twait and the accumulation duration Tacc may be not necessary. Alternatively, lengths of the waiting duration Twait and the accumulation duration Tacc can be adjust to meet the practice demand.

Figure 4A:
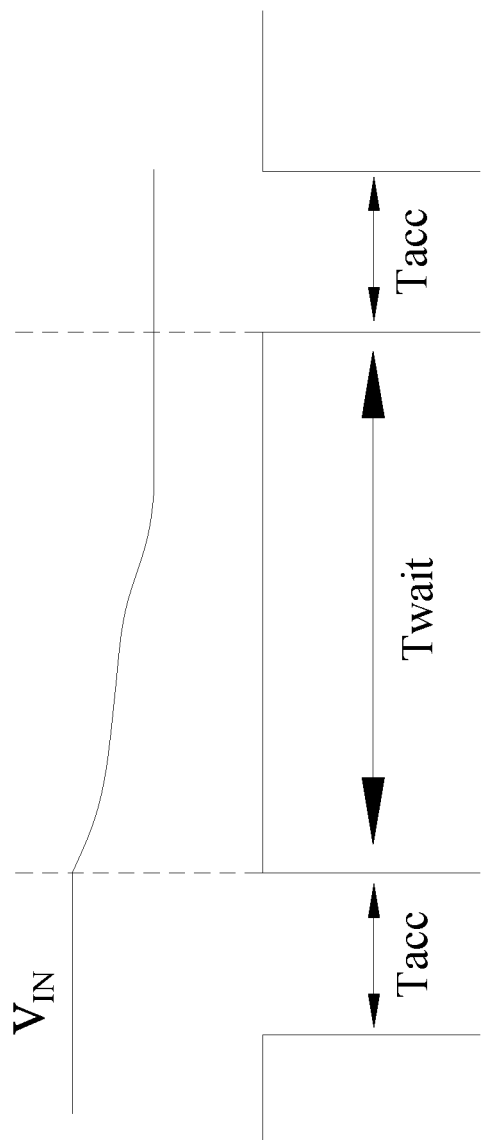
FIG. 4A is a schematic view of variation of the input voltage of charge pump, during accumulation durations and waiting durations.

Please refer to FIG. 4A which shows voltage curves in the accumulation duration Tacc and the waiting duration Twait. After the accumulation duration Tacc is ended, the power optimization device 3 performs the output power comparison to determine adjustment of the frequency. While the operating frequency f is changed, the input voltage $V_{IN}$ is changed correspondingly, as shown in FIG. 4A, in the waiting duration Twait the input voltage $V_{IN}$ is changed and then stable in a constant voltage corresponding to the adjusted frequency and the output voltage. During the accumulation duration Twait, the output voltage $V_{CP}$ is continuously accumulated. Higher the output power is, faster the voltage accumulation speed is. In a fixed duration, the accumulated voltage becomes higher. During accumulation duration Tacc, the output terminal connected to the electricity storage unit BAT can be viewed as a relatively stable DC voltage level and the input voltage is also viewed as stable, so the variation of the output power corresponding to the change of the operating frequency f can be estimated by the counting manner.

Figure 4B:
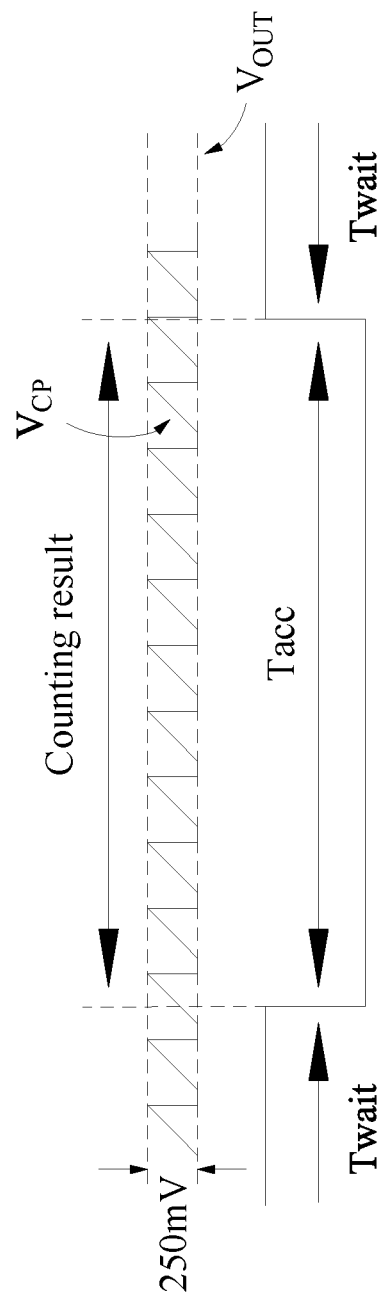
FIG. 4B shows relationship between the voltage Vcp outputted from the charge pump and an output voltage $V_{OUT}$.

Please refer to FIG. 4B which shows a relationship between the voltage Vcp outputted from the charge pump and an output voltage $V_{OUT}$. Every time the output voltage VCP of the charge pump is charged to exceed 250 mV, the switch 304 is turned on to enable the output terminal of the charge pump to temporarily connect with the electricity storage unit BAT, so that the electrical charge stored in the capacitor $C_L$ is inputted into the electricity storage unit BAT and, in the meantime the output voltage $V_{OUT}$ is kept at the relatively stable DC voltage. Therefore, by means of above operation, the charge pump can repeatedly charge the electricity storage unit BAT.

In addition, during the accumulation duration Tacc, the registers REG1 and REG2 are configured to respectively count the times that the output voltage Vcp exceeds 250 mV for further comparison of the comparator COMP2. Generally speaking, longer accumulation duration Tacc is helpful for obtaining more accurate output power. The registers REG1 and REG2 respectively store the Nth and (N+1)th counting results which are compared by the comparator COMP2 to generate a second comparison result. When the second comparison signal indicates that the (N+1)th counting result is larger than the Nth counting result, a frequency control unit of the frequency control module 308 is configured to increase the operating frequency f of the charge pump 300; when the second comparison signal indicates that the (N+1)th counting result is smaller than the Nth counting result, the frequency control unit of the frequency control module 308 decreases the operating frequency f. A numerically controlled oscillator (NCO) can be configured to control the operating frequency f of the charge pump 300, as shown in FIG. 3. The NCO increases or decreases the operating frequency f of the charge pump 300 according to the second comparison result between the values stored in the registers REG1 and REG2, so as to achieve the maximum output power point.

Figure 5:
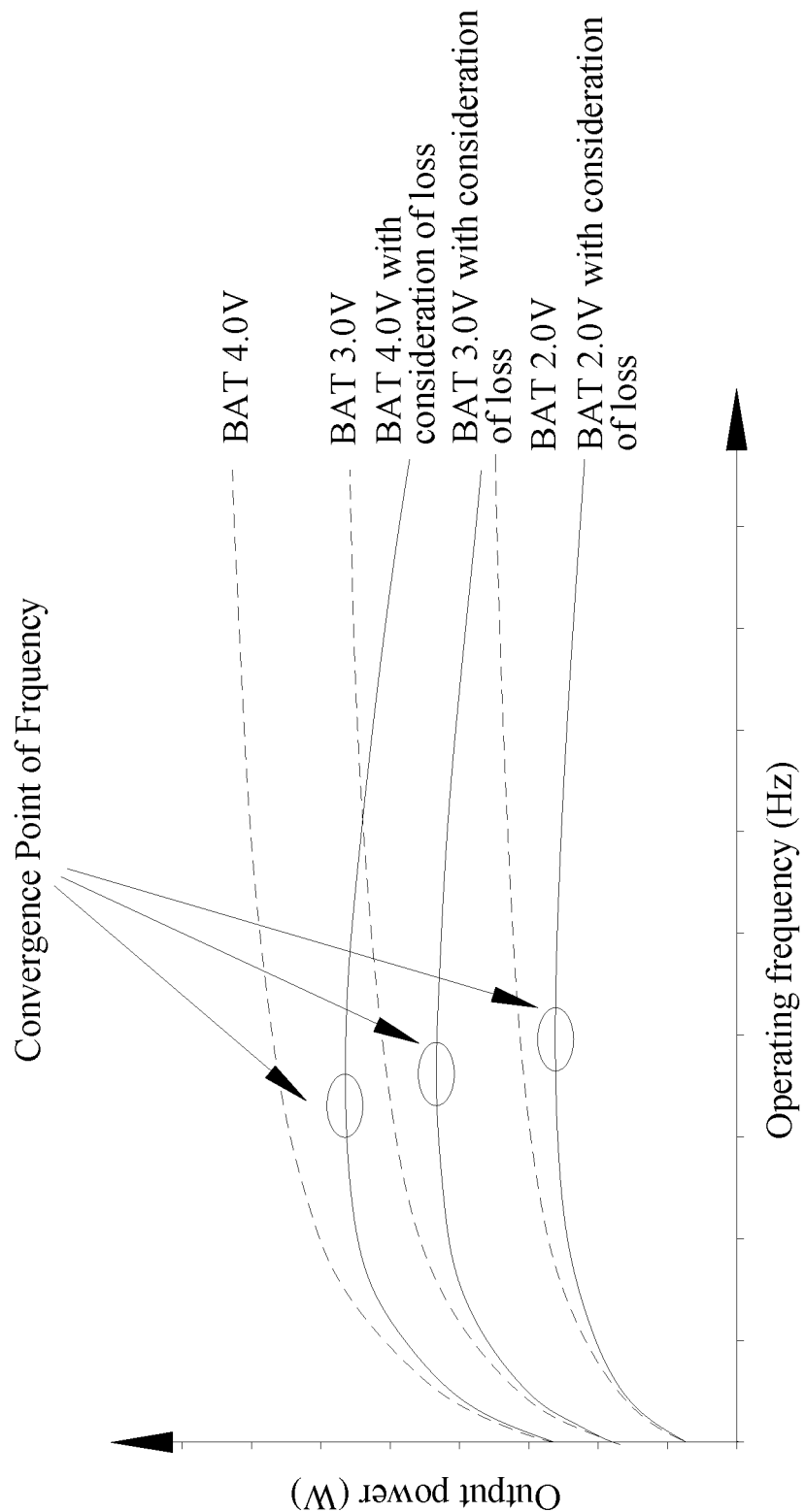
FIG. 5 shows output power versus frequency curves of the charge pump with different output voltages of loads.

Please refer to FIG. 5 which shows output power versus frequency curves under different output voltages ($V_{OUT}=V_{BAT}$=2.0, 3.0, and 4.0V), in accordance with the present disclosure. In FIG. 5, the power consumption corresponding to the operating frequency f is considered, and it is assumed that increasing of the operating frequency f by 100 KHz causes the input current consumption by 0.5 uA. Moreover, the curves shown in FIG. 5 include the output power versus frequency curves with and without the consideration of the power consumption caused by the operating frequency. Each of the output power versus frequency curves with consideration of the power consumption caused by increasing of the operating frequency has characteristic of para-curve, the maximum value of the output power corresponds to one optimal operating frequency. Therefore, aforesaid circuit configuration and operation flow can be used to reach the optimal operating frequency.

Figure 6:
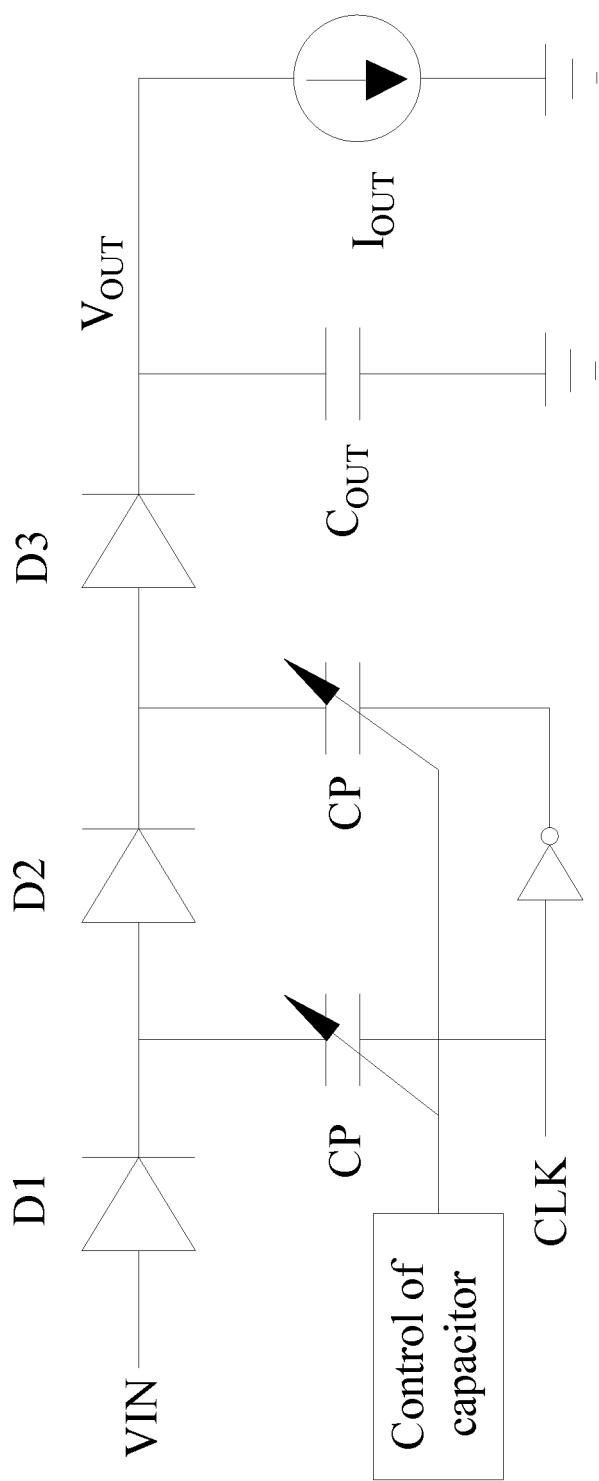
FIG. 6 is schematic circuit diagram of other embodiment of the charge pump of power optimization device of the present disclosure.

Please refer to FIG. 6 which shows a schematic view of other embodiment of the charge pump of power optimization device for energy harvesting apparatus, in accordance with the present disclosure. Among from changing the operating frequency to adjust the equivalent resistance $R_{CP}$ ($R_{CP}=N/(f*Cp)$) of the charge pump, in other embodiment the capacitance of the capacitor Cp of the charge pump can also be changed to achieve the effect of adjusting the equivalent resistance Rcp. In the way of changing capacitance of the capacitor Cp to adjust the equivalent resistance Rcp, the NCO can be replaced by the oscillator outputting fixed frequency numerically controlled oscillator, the output signal outputted by the comparator COMP2 is used to change the capacitance value of the capacitor Cp of the charge pump.

Figure 7:
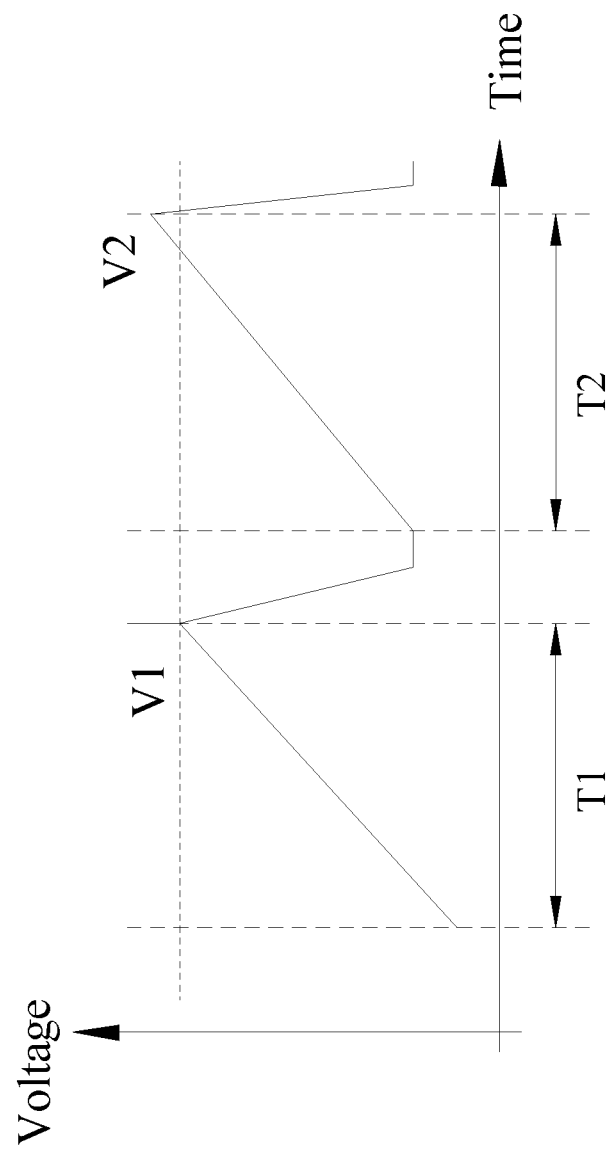
FIG. 7 shows a graph of an output voltage of the power optimization device of an alternative embodiment of the present disclosure.

Please refer to FIG. 7 which shows output voltage $V_{OUT}$ versus time curve of alternative embodiment of the power optimization device for energy harvesting apparatus, in accordance with the present disclosure. The difference between this embodiment and aforesaid embodiments is that the magnitude of the output power of the charge pump can be determined according to the magnitude of increasing of the output voltage in a specific duration. As shown in FIG. 7, lengths of the durations T1 and T2 are the same, when the highest magnitude of the voltage V2 in the duration T2 is larger than that of the voltage V1 in the duration T1, the operating frequency f is increased; otherwise, the operating frequency f is decreased.

Figure 8:
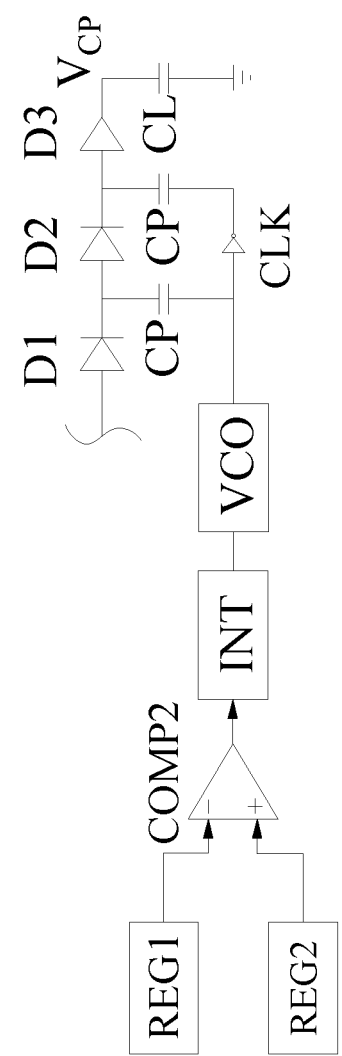
FIG. 8 is a schematic view of a frequency control unit of the power optimization device of other embodiment of the present disclosure.

Please refer to FIG. 8 which shows a schematic view of other embodiment of the frequency control unit of the power optimization device for the energy harvesting apparatus, in accordance with the present disclosure. The difference between this embodiment and aforesaid embodiments is that the numerically controlled oscillator NCO is implemented by an analog integrator INT and a voltage controlled oscillator VCO. The analog integrator INT is configured to integrate the comparison result, the voltage controlled oscillator VCO is configured to control the frequency according to an output signal of the analog integrator INT.

Figure 9:
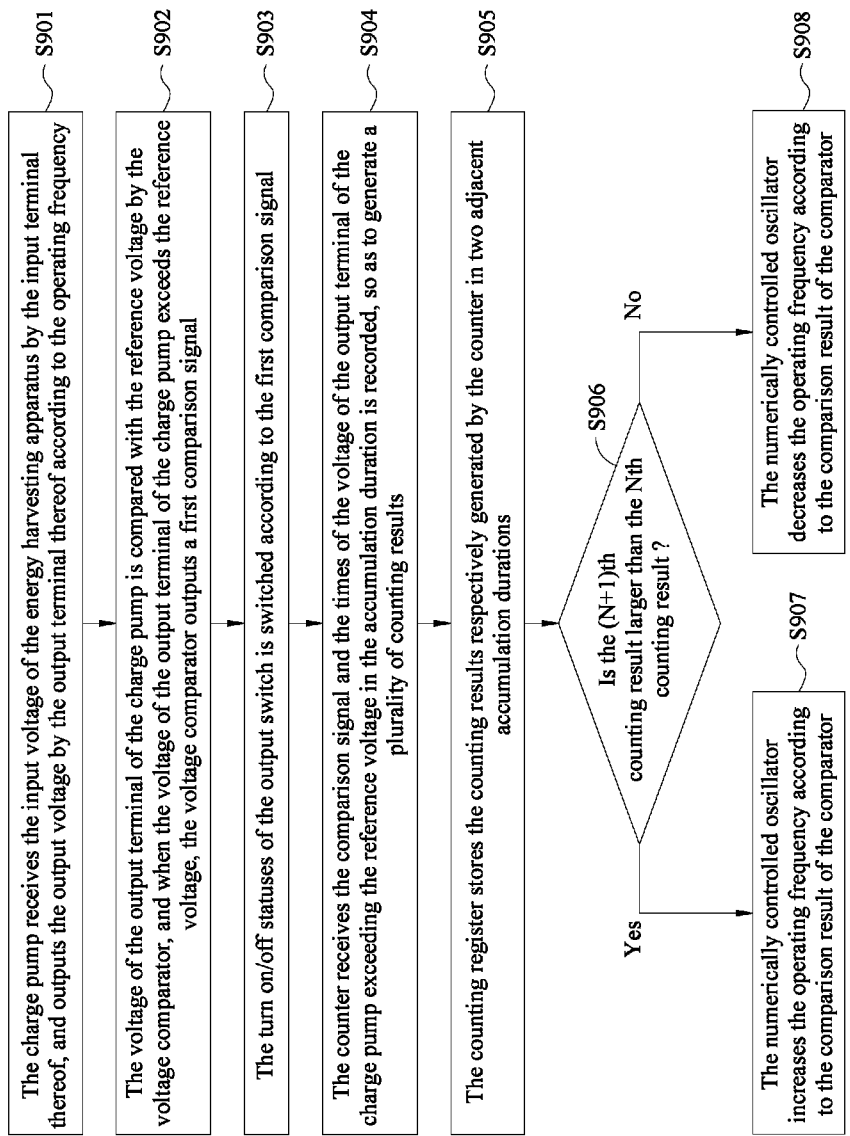
FIG. 9 is a flowchart of an embodiment of a power optimization method for the energy harvesting apparatus, in accordance with the present disclosure.

Please refer to FIG. 9 which shows a flowchart of an embodiment of power optimization method for the energy harvesting apparatus, in accordance with the present disclosure. The power optimization method includes following steps.

In a step S901, the charge pump receives the input voltage of the energy harvesting apparatus by the input terminal thereof, and outputs the output voltage by the output terminal thereof according to the operating frequency.

In a step S902, the voltage of the output terminal of the charge pump is compared with the reference voltage by the voltage comparator, and when the voltage of the output terminal of the charge pump exceeds the reference voltage, the voltage comparator outputs a first comparison signal.

In a step S903, the turn on/off statuses of the output switch is switched according to the first comparison signal.

In a step S904, the counter receives the comparison signal and the times of the voltage of the output terminal of the charge pump exceeding the reference voltage in the accumulation duration is recorded, so as to generate a plurality of counting results for different operating frequencies.

In a step S905, the counting register stores the counting results respectively generated by the counter in two adjacent accumulation durations.

In a step S906, the comparator compares the values stored in the counting registers to generate a second comparison signal, and when the new counting result is larger than the previous counting result, the method proceeds a step S907 where the numerically controlled oscillator increases the operating frequency according to the comparison result of the comparator; when the new counting result is smaller than the previous counting result, the method proceeds a step S908 where the numerically controlled oscillator decreases the operating frequency according to the comparison result of the comparator.

It is to be noted that the circuit configuration described in each of the steps is similar to the description in aforesaid embodiments, one of ordinary skill in the art can implements the power optimization method for the energy harvesting apparatus according to the description of the aforesaid embodiments and the steps, so the detailed description is omitted.

In conclusion, in the embodiment, the power optimization device and method for the energy harvesting apparatus can detect the output voltages under different operating frequencies and increase or decrease the operating frequency of the charge pump according to the detection result, so as to dynamically adjust the operating frequency according to the voltage outputted by the energy harvesting apparatus, to achieve the optimization of the output power.

In addition, without using the inductor as an energy storage element and wasting energy to detect the open-circuit voltage, the power optimization device and method of the present disclosure has advantages of small size, flexible usage and insensitive to ambient temperature.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. A power optimization device for energy harvesting apparatus, comprising:
    a charge pump comprising an input terminal, an output terminal and a control terminal, and the charge pump configured to receive an input voltage of the energy harvesting apparatus by the input terminal, and output an output voltage according to an operating frequency by the output terminal;
    a voltage comparator electrically connected to the output terminal of the charge pump and configured to compare a voltage of the output terminal of the charge pump with a reference voltage, and output a first comparison signal when the voltage is equal to or higher than the reference voltage;
    an output switch electrically connected between the output terminal of the charge pump and an electricity storage unit, and switched between a turn-on status and a turn-off status according to the first comparison signal;
    a counter electrically connected to an output terminal of the voltage comparator, and configured to receive the first comparison signal and respectively record the times of the voltages of the output terminal of the charge pump equal to or higher than the reference voltage in voltage accumulation durations under different operating frequencies, so as to generate a plurality of counting results; and
    a frequency control module electrically connected between the counter and the control terminal of the charge pump, and configured to compare the counting results generated in the two adjacent voltage accumulation durations to generate a second comparison result, and adjust the operating frequency of the charge pump according to the second comparison result.

2. The power optimization device according to claim 1, wherein the frequency control module comprises:
    a counting register configured to store the two counting results respectively generated in the two adjacent voltage accumulation durations, and wherein one of the two counting results is generated later than the other;
    a comparator configured to compare the counting results and output a second comparison signal; and a frequency control unit electrically connected between the comparator and the control terminal of the charge pump, wherein when the second comparison signal indicates that the counting result generated later is higher than the other, the frequency control unit is configured to increase the operating frequency according to the second comparison signal, and when the second comparison signal indicates that the counting result generated latter is lower than the other, the frequency control unit is configured to decrease the operating frequency according to the second comparison signal.

3. The power optimization device according to claim 2, wherein the frequency control unit comprises a digital comparator and a numerically controlled oscillator, the digital comparator is configured to compare the values stored in the counting register, and the numerically controlled oscillator is configured to increase or decrease a frequency of the numerically controlled oscillator according to a comparison result of the digital comparator, so as to adjust the operating frequency.

4. The power optimization device according to claim 1, wherein the reference voltage is defined by the voltage of the output terminal plus a preset voltage value.

5. The power optimization device according to claim 1, further comprising a low frequency oscillator electrically connected to the counter, wherein the low frequency oscillator is configured to generate the voltage accumulation duration, and a waiting duration between the two adjacent voltage accumulation durations.

6. A power optimization method for energy harvesting apparatus, applied to operate a power optimization device of claim 1, and the power optimization method comprising:
   at an input terminal of a charge pump of the power optimization device, receiving an input voltage from the energy harvesting apparatus, and at an output terminal of the power optimization device, outputting an output voltage according to an operating frequency;
   comparing, by a voltage comparator of the power optimization device, the voltage of the output terminal of the charge pump with a reference voltage, and outputting a first comparison signal when the voltage of the output terminal of the charge pump is equal to or higher than the reference voltage;
   controlling an output switch which is electrically connected between the output terminal of the charge pump and an electricity storage unit, to switch between a turn on status and a turn-off status according to the first comparison signal;
   receiving the comparison signal, by a counter of the power optimization device, and respectively recording times of the voltages of the output terminal of the charge pump equal to or higher than the reference voltage under different operating frequencies, so as to generate a plurality of counting results; and
   comparing the two counting results generated in the two adjacent voltage accumulation durations, by a frequency control module of the power optimization device, to generating a second comparison result, and then adjusting an operating frequency of the charge pump according to the second comparison result.

7. The power optimization method according to claim 6, wherein the step of adjusting the operating frequency of the charge pump according to the second comparison result further comprises:
   storing, by two counting registers, the plurality of counting results respectively generated by the counter in the two adjacent voltage accumulation durations, wherein one of the two counting results is generated later than the other;
   comparing, by a comparator of the power optimization device, the two counting results to output a second comparison signal; and increasing, by a frequency control unit of the power optimization device, the operating frequency when the counting result generated later is higher than the other; decreasing the operating frequency when the counting result generated later is lower than the other.

8. The power optimization method according to claim 7, wherein the step of adjusting the operating frequency according to the second comparison signal, further comprises:
   comparing, by a digital comparator, the values stored in the counting registers; and
   providing a numerically controlled oscillator, and increasing or decreasing a frequency of the numerically controlled oscillator according to an output of the digital comparator, so as to adjust the operating frequency.

9. The power optimization method according to claim 6, wherein the reference voltage is defined by the voltage of the output terminal plus a preset voltage.

10. The power optimization method according to claim 6, further comprising:
   providing a low frequency oscillator to generate the voltage accumulation duration and a waiting duration between the two adjacent voltage accumulation durations.

* * * * *